(12) United States Patent
Caplet et al.

(10) Patent No.: US 6,546,623 B2
(45) Date of Patent: Apr. 15, 2003

(54) STRUCTURE EQUIPPED WITH ELECTRICAL CONTACTS FORMED THROUGH THE SUBSTRATE OF THIS STRUCTURE AND PROCESS FOR OBTAINING SUCH A STRUCTURE

(75) Inventors: Stéphane Caplet, Sassenage (FR); Marie-Thérèse Delaye, Fontaine (FR)

(73) Assignee: Commissariat a l'Energie Atomique, Paris (FR)

(*) Notice: Subject to any disclaimer, the term of this patent is extended or adjusted under 35 U.S.C. 154(b) by 0 days.

(21) Appl. No.: 10/095,477

(22) Filed: Mar. 13, 2002

(65) Prior Publication Data

US 2002/0088646 A1 Jul. 11, 2002

Related U.S. Application Data

(62) Division of application No. 09/529,411, filed as application No. PCT/FR98/02286 on Oct. 26, 1998, now Pat. No. 6,392,158.

(30) Foreign Application Priority Data

Oct. 27, 1997 (FR) .............................................. 97 13441

(51) Int. Cl.[7] .................................................. H05K 3/10
(52) U.S. Cl. ............................... 29/846; 29/830; 29/852
(58) Field of Search ............................ 29/825, 830, 850, 29/896, 852, 832

(56) References Cited

U.S. PATENT DOCUMENTS

| 3,440,098 A | 4/1969 | Stachurski ..................... 136/6 |
| 3,451,851 A | 6/1969 | Stanimirovitch ............. 136/30 |
| 3,639,173 A | 2/1972 | Stachurski ..................... 136/3 |
| 3,660,170 A | 5/1972 | Rampel ....................... 136/154 |
| 3,663,298 A | 5/1972 | McCoy et al. ................ 136/31 |
| 3,716,413 A | 2/1973 | Eisner ........................... 136/86 |
| 3,767,466 A | 10/1973 | McCoy et al. ............... 136/131 |
| 3,811,952 A | 5/1974 | Siwersson et al. ............ 136/86 |
| 3,847,671 A | 11/1974 | Leparulo et al. .............. 136/86 |
| 3,879,225 A | 4/1975 | Backhurst et al. ............ 136/86 |
| 3,887,400 A | 6/1975 | Doniat et al. ................. 136/86 |
| 3,902,918 A | 9/1975 | Pompon ....................... 136/86 |
| 3,930,882 A | 1/1976 | Ohsawa et al. ............... 136/30 |
| 3,944,430 A | 3/1976 | Lee .............................. 136/30 |
| 3,970,472 A | 7/1976 | Steffensen ...................... 136/3 |
| 3,981,747 A | 9/1976 | Doniat et al. ................. 429/15 |
| 3,985,581 A | 10/1976 | Stachurski et al. ........... 429/51 |
| 4,074,028 A | 2/1978 | Will ............................ 429/105 |
| 4,105,829 A | 8/1978 | Venero ........................ 429/15 |

(List continued on next page.)

FOREIGN PATENT DOCUMENTS

| EP | 0568822 A2 | 11/1993 |
| EP | 0755088 A2 | 1/1997 |
| FR | 2639767 | 11/1988 |
| FR | 2669775 | 11/1990 |
| JP | 51-494439 | 4/1976 |
| WO | WO 00/38260 | 6/2000 |

OTHER PUBLICATIONS

Appleby, A. J. et al.: *The C.G.E. Circulating Zinc/Air Battery: A Practical Vehicle Power Source;* Journal of Power Sources; 1976/1977; vol. 1; pp. 17–24.

(List continued on next page.)

*Primary Examiner*—Carl J. Arbes
(74) *Attorney, Agent, or Firm*—Oblon, Spivak, McClelland, Maier & Neustadt, P.C.

(57) ABSTRACT

A process for manufacturing a structure equipped with at least one electrical contact, including forming on a substrate a first layer, forming on a front side of the first layer the structure equipped with at least one electrical contact, forming at least one hole though the substrate revealing a rear side of the first layer, and forming an electrical contact to the rear side in a cavity overhung by an edge of the at least one hole closest to the first layer, the edge allowing for electrical insulation of the electrical contact from the substrate.

11 Claims, 4 Drawing Sheets

U.S. PATENT DOCUMENTS

| | | | | |
|---|---|---|---|---|
| 4,107,836 A | * | 8/1978 | Roberts | 29/852 |
| 4,107,837 A | * | 8/1978 | Chang | 29/852 |
| 4,127,701 A | | 11/1978 | Symons et al. | 429/19 |
| 4,145,482 A | | 3/1979 | von Benda | 429/27 |
| 4,147,839 A | | 4/1979 | Solomon et al. | 429/15 |
| 4,172,924 A | | 10/1979 | Warszawski | 429/15 |
| 4,182,383 A | | 1/1980 | Adomitis et al. | 141/5 |
| 4,198,475 A | | 4/1980 | Zaromb | 429/15 |
| 4,218,521 A | | 8/1980 | Putt et al. | 429/39 |
| 4,272,333 A | | 6/1981 | Scott et al. | 204/23 |
| 4,287,273 A | | 9/1981 | Harney et al. | 429/153 |
| 4,352,864 A | | 10/1982 | Struthers | 429/18 |
| 4,415,636 A | | 11/1983 | Charkey | 429/27 |
| 4,479,856 A | | 10/1984 | Ando | 204/55 |
| 4,485,154 A | | 11/1984 | Remick et al. | 429/14 |
| 4,563,403 A | | 1/1986 | Julian | 429/198 |
| 4,730,153 A | | 3/1988 | Breting et al. | 320/14 |
| 4,731,547 A | | 3/1988 | Alenduff et al. | 307/85 |
| 4,802,100 A | | 1/1989 | Aasen et al. | 364/494 |
| 4,828,939 A | | 5/1989 | Turley et al. | 429/38 |
| 4,842,963 A | | 6/1989 | Ross, Jr. | 429/21 |
| 4,855,030 A | | 8/1989 | Miller | 204/212 |
| 4,950,561 A | | 8/1990 | Niksa et al. | 429/27 |
| 5,006,424 A | | 4/1991 | Evans et al. | 429/15 |
| 5,156,925 A | | 10/1992 | Lapp | 429/19 |
| 5,168,905 A | | 12/1992 | Phallen | 141/1 |
| 5,188,911 A | | 2/1993 | Downing et al. | 429/70 |
| 5,196,275 A | | 3/1993 | Goldman et al. | 429/27 |
| 5,208,526 A | | 5/1993 | Goldman et al. | 320/2 |
| 5,260,144 A | | 11/1993 | O'Callaghan | 429/14 |
| 5,312,699 A | | 5/1994 | Yanagi et al. | 429/22 |
| 5,316,869 A | | 5/1994 | Perry, Jr. et al. | 429/19 |
| 5,318,861 A | | 6/1994 | Harats et al. | 429/21 |
| 5,346,778 A | | 9/1994 | Ewan et al. | 429/19 |
| 5,348,820 A | | 9/1994 | Suga et al. | 429/216 |
| 5,360,680 A | | 11/1994 | Goldman et al. | 429/27 |
| 5,366,829 A | | 11/1994 | Saidi | 429/216 |
| 5,369,353 A | | 11/1994 | Erdman | 323/207 |
| 5,378,329 A | | 1/1995 | Goldstein et al. | 204/115 |
| 5,382,482 A | | 1/1995 | Suga et al. | 429/206 |
| 5,401,589 A | | 3/1995 | Palmer et al. | 429/13 |
| 5,405,713 A | | 4/1995 | Pecherer et al. | 429/49 |
| 5,411,815 A | | 5/1995 | Goldstein | 429/50 |
| 5,427,872 A | | 6/1995 | Shen et al. | 429/142 |
| 5,432,710 A | | 7/1995 | Ishimaru et al. | 364/493 |
| 5,434,020 A | | 7/1995 | Cooper | 429/210 |
| 5,434,021 A | | 7/1995 | Fauteux et al. | 429/213 |
| 5,441,820 A | | 8/1995 | Siu et al. | 429/17 |
| 5,462,815 A | | 10/1995 | Horiuchi | 429/13 |
| 5,476,293 A | | 12/1995 | Yang | 290/4 |
| 5,500,561 A | | 3/1996 | Wilhelm | 307/64 |
| 5,546,655 A | * | 8/1996 | Feger et al. | 29/852 |
| 5,547,778 A | | 8/1996 | Fauteux et al. | 429/81 |
| 5,558,947 A | | 9/1996 | Robison | 429/13 |
| 5,563,802 A | | 10/1996 | Plahn et al. | 364/492 |
| 5,569,551 A | | 10/1996 | Pedicini et al. | 429/27 |
| 5,578,183 A | | 11/1996 | Cooper | 205/64 |
| 5,635,051 A | | 6/1997 | Salas-Morales et al. | 205/602 |
| 5,637,414 A | | 6/1997 | Inoue et al. | 429/13 |
| 5,638,598 A | * | 6/1997 | Nakaso et al. | 29/852 |
| 5,780,186 A | | 7/1998 | Casey, Jr. | 429/229 |
| 5,783,932 A | | 7/1998 | Namba et al. | 322/16 |
| 5,795,666 A | | 8/1998 | Johnssen | 429/17 |
| 5,795,679 A | | 8/1998 | Kawakami et al. | 429/218 |
| 5,824,434 A | | 10/1998 | Kawakami et al. | 429/209 |
| 5,849,427 A | | 12/1998 | Siu et al. | 429/19 |
| 5,869,200 A | | 2/1999 | Nunnally | 429/10 |
| 5,880,536 A | | 3/1999 | Mardirossian | 307/44 |
| 5,885,727 A | | 3/1999 | Kawatsu | 429/17 |
| 5,929,538 A | | 7/1999 | O'Sullivan et al. | 307/66 |
| 5,952,117 A | | 9/1999 | Colborn et al. | 429/27 |
| 5,958,210 A | | 9/1999 | Siu et al. | 205/602 |
| 5,961,928 A | | 10/1999 | Maston et al. | 422/110 |
| 5,969,435 A | | 10/1999 | Wilhelm | 307/64 |
| 5,984,986 A | | 11/1999 | Wiesheu et al. | 48/203 |
| 5,985,474 A | | 11/1999 | Chen et al. | 429/17 |
| 5,999,888 A | | 12/1999 | Aubee | 702/45 |
| 6,051,192 A | | 4/2000 | Maston et al. | 422/110 |
| 6,067,482 A | | 5/2000 | Shapiro | 700/286 |
| 6,153,329 A | | 11/2000 | Raschilla et al. | 429/65 |
| 6,153,555 A | | 11/2000 | Narula et al. | 502/303 |
| 6,162,555 A | | 12/2000 | Gutierrez et al. | 429/15 |
| 6,186,254 B1 | | 2/2001 | Mufford et al. | 180/65.3 |
| 6,228,511 B1 | * | 5/2001 | Sachdev et al. | 29/852 |
| 6,230,496 B1 | | 5/2001 | Hofmann et al. | 60/706 |
| 6,242,873 B1 | | 6/2001 | Drozdz et al. | 318/139 |
| 6,266,874 B1 | * | 7/2001 | DiStefano et al. | 29/852 |
| 6,296,958 B1 | | 10/2001 | Pinto et al. | 429/15 |
| 6,321,145 B1 | | 10/2001 | Rajashekara | 701/22 |
| 6,326,763 B1 | | 12/2001 | King et al. | 320/101 |

OTHER PUBLICATIONS

Appleby, A. J. et al.: *Charge–Discharge Behavior of the C.G.E. Circulating Zinc–Air Vehicle Battery;* Society of Automotive Engineers, Cobo Hall, Detroit; Feb. 28–Mar. 4, 1977.

Cooper, J., et al.; *Demonstration of a Zinc/Air Fuel Battery to Enhance the Range and Mission of Fleet Electric Vehicles: Preliminary Results in the Refueling of a Multicell Module;* 29th Intersociety Energy Conversion Engineering Conference; Aug. 8, 1994; 8 pages.

Cooper, J.; *How the Zinc/Air Battery is Refueling the Competitiveness of Electric Vehicles;* Science & Technology Review ; Oct. 1995; pp. 7–13.

* cited by examiner

STRUCTURE EQUIPPED WITH ELECTRICAL CONTACTS FORMED THROUGH THE SUBSTRATE OF THIS STRUCTURE AND PROCESS FOR OBTAINING SUCH A STRUCTURE

This application is related to U.S. patent application Ser. No. 09/627,742, entitled "System and Method for Power Management," filed Jul. 28, 2000; U.S. patent application Ser. No. 09/930,557, entitled "Power System Including Heat Removal Unit For Providing Backup Power To One Or More Loads," filed Aug. 15, 2001; U.S. patent application Ser. No. 09/930,394, entitled "Metal Fuel Cell System For Providing Backup Power To One Or More Loads," filed Aug. 15, 2001; U.S. Provisional Application No. 60/318,685, entitled "Ultra-Long Duration Backup For Critical Applications Using Zinc/Air Regenerative Fuel Cells," filed Sep. 10, 2001; U.S. Provisional Application No. 60/328,838, entitled "Ultra-Long Duration Backup For Telecommunications Applications Using Zinc/Air Regenerative Fuel Cells," filed Oct. 11, 2001; and U.S. patent application Ser. No.10/058,231, "Methods of Using Fuel Cell System Configured To Provide Power To One Or More Loads," filed Oct. 19, 2001. Each of the foregoing applications is hereby fully incorporated herein by reference as though set forth in full.

FIELD OF THE INVENTION

This invention involves a structure formed on a substrate and equipped with an electrical contact or several electrical contacts as well as a process for obtaining such a structure.

The invention applies in particular to any type of structure (for example an acceleration meter, a pressure sensor or an actuator) formed on the surface of an appropriate layer.

This layer can be electrically conducting (in silicon or polysilicon for example) and formed on an electrical insulator.

STATE OF THE PRIOR ART

Electromechanical micro-systems formed on chips are already known from surface manufacturing techniques.

In order to electrically connect a chip on which such a micro-system is formed with the outside world, metallic contact studs are formed on the surface of this chip to act as an interface between the electrically active zones of the chip and the outside world, this latter being for example an electronic measuring device.

In some cases, the micro-system must be maintained in a confined medium for hermetic reasons.

In such cases, it is known that the chip can be equipped with a cap which encloses the micro-system.

This is schematically illustrated in FIG. 1.

The figure shows the chip 2 and the contact studs 4 which are connected by contact lines 6 to the electrically active zones (not shown) of the chip.

It also shows the cap 8 which covers the micro-system (not shown) but not the contact studs which are usually accessible on one side of the chip.

Such a cap complicates the formation of electrical contacts with the micro-system.

The formation of the contact lines 6 which end at the contact studs 4, with an electrical passage from the zone covered by the cap 8 to its exterior and more precisely to the zone where the contact studs appear, affects the evenness of the zone which is to be sealed.

To form each contact line 6, a several hundred nanometers thick metallic deposit is formed.

Such deposits create steps which can be obstacles for sealing, especially if the sealing is to be hermetic.

This is schematically illustrated by FIG. 2 which is a schematic cross-section view of FIG. 1 at the level of the contact lines 6.

FIG. 2 also shows electrically insulating layers 10 which are interposed between the contact lines 6 and the chip 2 itself.

As an example, Silicon Direct Binding requires perfect evenness of the chip and the cap.

The steps are thus a crippling hindrance for this type of sealing.

Anodic sealing, on the other hand, does not require perfect evenness. This does not guarantee a hermetic seal however.

This is schematically illustrated in FIG. 3.

FIG. 3 shows that a glass substrate 12 and a silicon chip 2 can be sealed to each other on both sides of the steps but that there are areas 14 which are poorly sealed which act as vents.

This means that the anodic seal is not hermetic.

Another known technique involves metallisation through a hole on a glass cap which is anodically sealed so that no contact line crosses the seal.

The following document may be consulted on this subject:

M. Esashi, Y. Matsumoto and S. Shoji, "Absolute Pressure Sensors by Air-tight Electrical Feedthrough Structure", Sensors and Actuators, A21–A23 (1990) 1048–1052.

This is schematically illustrated by FIG. 4 which shows the chip 2 which is sealed to the glass cap 16.

This glass cap is crossed by a hole 17 and FIG. 4 shows the metallic layer 18 resulting from the metallisation of the chip through this hole.

It also shows metallic layers 19 which were formed on the cap at the time of the formation of the layer 18.

The active structure (an acceleration meter, pressure sensor or actuator) and the glass cap are each formed separately before being sealed to each other.

This known technique could possibly be applied to sealing a chip and a silicon cap.

This raises the issue of compatibility of treatment between the forming of the hole, the type of sealing, the preparation of the surface before metallization and the annealing of this metallization.

The main drawback of this known technique is that the various substrates are first treated and then assembled.

In addition, this technique requires the use of a glass cap and a rather complex process for making this cap.

SUMMARY OF THE INVENTION

The invention aims to overcome the previous drawbacks.

This invention provides a structure (e.g. the micro-system) and electrical contacts to the structure in a stack of layers, this stack formed before the making of the structure.

This stack could be a usual monolithic stack or a standard stack of the SIMOX type for example.

The structure equipped with electrical contacts is obtained with this stack.

The capping of this structure, if required, can be obtained by various techniques such as:

sealing with a polymer
anodic sealing or
sealing with a technique called "Silicon Direct Bonding"

According to the invention, each electrical contact is formed on the rear side of the layer in which the structure is formed, through a hole formed in the substrate on which this layer lies.

This approach differs from the state of the art mentioned above in which electrical contacts are only formed on the front side of the layer.

More precisely, the invention resolves the following problems: (a) obtaining a structure which includes a layer formed on a substrate and equipped with an electrical contact formed facing this substrate and electrically insulated from it (thus minimizing the stray capacitance which exists between the contact and the substrate) and (b) being able to form the contact during the very last phase of manufacturing of the structure and, more precisely, determining an architecture which demarcates the contact(s) so that the contact(s) can be made with a simple conducting deposit without an additional etching step.

The invention defines a stack including a micro-system having an electrical contact to connect the micro-system to the outside world, a substrate having a first layer formed on the substrate, a through hole extending in an axial direction of the substrate and configured to reveal a rear side of the first layer and to provide a passage to electrically connect to the electrical contact, and a cavity located at an end of the through hole close to the first layer, electrical contact, and a cavity located at an end of the through hole close to the first layer, wherein the cavity has dimensions transverse to the axial direction larger than a diameter of the through hole and forms an overhanging edge around the through hole.

According to a particular embodiment of the invention structure, the first layer is electrically conducting, the substrate includes a second layer which is electrically insulating and the first layer rests on this second layer.

This invention also involves a process for manufacturing a structure equipped with at least one electrical contact, this process being characterised in that a first layer is formed on a substrate, the structure is formed in this first layer, on its front side, and at least one hole through the substrate, this hole exposing the rear side of the first layer, and with the electrical contact formed on this rear side, facing the hole, in a cavity overhung by the edge of the hole closest to the first layer, this overhang allowing for electrical insulation of the contact of the substrate.

According to a preferred embodiment of the invention process, a sacrificial layer is formed on the substrate, then the first layer on this sacrificial layer, this sacrificial layer is etched through the hole so that the edge of the hole closest to the first layer forms an overhang with respect to it and the electrical contact is formed on the rear side of the first layer through the hole.

The electrical contact is preferably formed by depositing of metal on the rear side of the first layer through the hole.

According to a particular embodiment of the invention process, the first layer is electrically conducting, the substrate includes a second layer which is electrically insulating and the sacrificial layer is formed on this second layer, then the first layer on this sacrificial layer.

According to a second particular embodiment, the first layer is electrically conducting, the substrate includes a second layer which is electrically insulating and the first layer is formed on this second layer, this second layer constituting the sacrificial layer.

The sacrificial layer can act as a blocking layer during the formation of each hole.

According to a particular embodiment of the invention, the hole formed by etching also allows for formation of a cavity and an overhang in the substrate on the rear side of the sacrificial layer. The sacrificial layer is then etched to the first layer.

Each hole can be formed before forming the structure in the first layer (or after having formed this structure) if the process allows this.

According to a particular embodiment of the invention process, after forming the structure in the first layer, a cap to confine the structure is formed on the front side of the first layer.

Each electrical contact may be formed before formation of the structure in the first layer but, if it is desired, each electrical contact can be formed after forming the structure in the first layer.

When a cap to confine the structure is formed, each electrical contact can be formed after forming this cap.

This invention has various advantages.

During the application of the invention, the front side of the first layer remains flat, without metallic contact lines which cause steps.

This allows for sealing of various types such as Silicon Direct Bonding or anodic sealing.

Anodic sealing is very valuable for hermetic vacuum encapsulation.

The invention is also very well-suited for use of a commercially available SOI substrate, such as for example a SIMOX type substrate or a Si—$SiO_2$—Si stack obtained by a Silicon Direct Bonding type technique.

In addition, the fact that the formation of the contacts (i.e. metallisation) can be done after the capping allows for the use of high temperature processes such as annealing of the seal when the Silicon Direct Bonding technique is used, at 1100° C. for example.

The fact that each hole also acts as a mechanical mask is also an advantage because this produes auto-alignment.

The "full-section" metallization also allows for renewed contact with the substrate during application of the invention.

BRIEF DESCRIPTION OF THE DRAWINGS

This invention will be better understood with the reading of the description of the embodiment examples below which are purely indicative and in no way limiting, with reference to the drawings in appendix in which.

DETAILED DESCRIPTION OF PARTICULAR EMBODIMENTS

Figure 1:
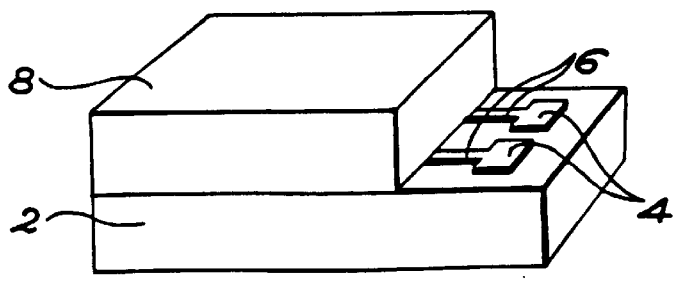
FIG. 1, already described, is a schematic view of a chip on which a cap is sealed, FIG. 2, already described, schematically illustrates steps formed on the surface of the chip by the electrical contact lines, FIG. 3, already described, schematically illustrates the formation of vents when a glass cap is sealed on a chip equipped with contact lines, FIG. 4, already described, schematically illustrates the formation of an electrical contact on a chip through a hole itself formed through a glass cap sealed to the chip, FIGS. 5 and 6 schematically illustrate a process according to the invention which uses a sacrificial layer, FIG. 7 schematically illustrates the formation of a short circuit when the sacrificial layer is not thick enough, FIG. 8 schematically illustrates a step in a process according to the invention, FIGS. 9 and 10 schematically illustrate steps in particular embodiments of the invention process, and FIGS. 11 to 15 schematically illustrate steps in a process according to the invention.
Figure 2:
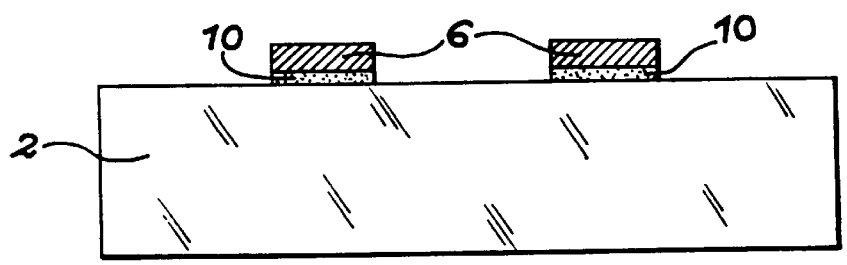
Figure 3:
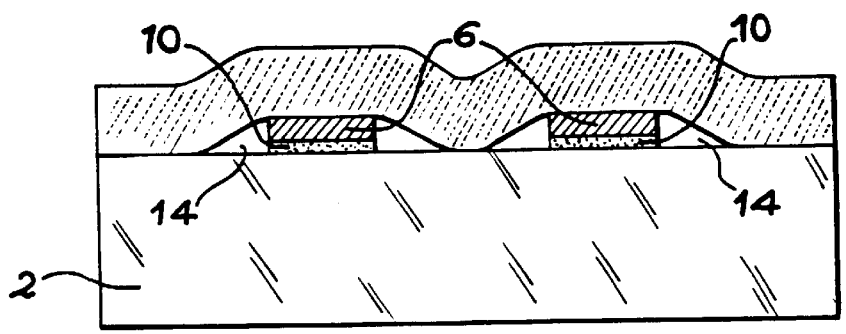
Figure 4:
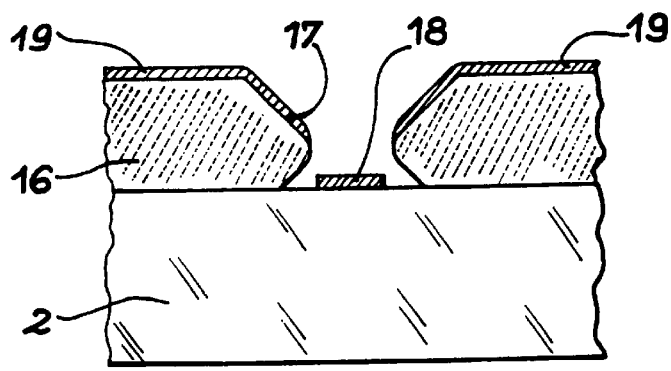
Figure 5:
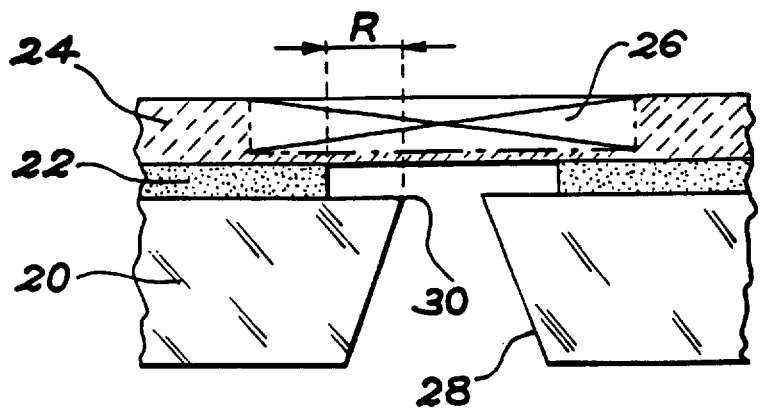

FIG. 5 schematically illustrates a process according to the invention.

FIG. 5 shows a cross-section of a substrate 20 on which a thin layer 22 called a sacrificial layer has been formed.

On this sacrificial layer, a first layer 24 is formed in which a structure 26 has been or will be formed on its front side which can be called an active element and which could be an electromechanical micro-system such as an accelerometer, a pressure sensor or an actuator.

The sacrificial layer 22 could be made of $SiO_2$ for example.

A hole 28 is etched through the substrate 20, this hole coming out at the sacrificial layer.

After the etching of this hole, the sacrificial layer can be locally etched by, for example, moist etching using hydrofluoric acid for a $SiO_2$ sacrificial layer so that the edge 30 of the hole closest to the first layer 24 forms an overhang with respect to this first layer 24.

Figure 6:
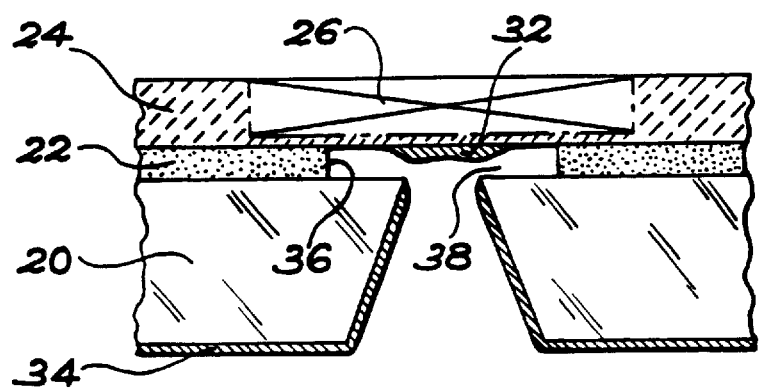

As the cross section in FIG. 6 schematically illustrates, this overhang makes it possible to make the metallic deposit 32 on the rear side of the layer 24 facing the hole 28, for example by vacuum evaporation or by cathodic spraying through the hole, without risk of creating a short circuit between this layer 24 and the substrate (if one or the other are conducting).

The metallic deposit 32 thus formed on the rear side of the first layer constitutes the electrical contact which was to be made.

An electrical connection not shown is thus formed or will be formed between this contact and the structure 26.

It is also seen in FIG. 6 that a metal layer 34 is also formed on the rear side of the substrate and on the walls of the hole.

The metal deposited through the hole 28, on the rear side of the layer 24, is sufficiently directive and cannot reach the bottom 36 of the cavity 38 which formed because of the recession of the sacrificial layer during its moist etching.

An example of a process for obtaining a structure in accordance with the invention from a stack of SOI type layers will now be considered.

The layer in which the structure or active element is formed is assumed to be electrically conducting.

A sufficiently doped layer of silicon could be used for example.

The substrate on which this layer rests could also be electrically conducting, for example in silicon or polysilicon.

This requires having an electrically insulating layer between the substrate and the layer of the active element.

This insulating layer could act as a sacrificial layer.

It could be made of $SiO_2$.

When the substrate is electrically insulating, made of glass for example, the sacrificial layer can be electrically insulating or electrically conducting.

The thickness of this sacrificial layer must be greater than the thickness of the metallic deposit to be formed on the rear side of the active element layer.

Otherwise, the hole must be enlarged before recessing the sacrificial layer and creating the overhang mentioned above by partial elimination of this sacrificial layer.

This sacrificial layer should not be too thick, otherwise the metal, during depositing, will also be deposited on the walls of the cavity created during the local etching of the sacrificial layer.

This would cause a short circuit.

Figure 7:
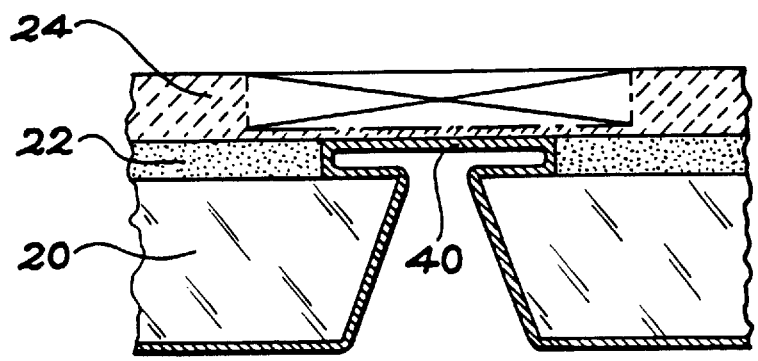

This is schematically illustrated in FIG. 7 which shows the substrate 20, the sacrificial layer 22 formed above this substrate, and the layer 24 in which the active element 26 has been or will be formed.

It also shows a metallic deposit 40 which covers not only all of the cavity formed in the sacrificial layer, but also the walls of the hole and the rear side of the substrate, thus causing a short circuit.

The thickness of the sacrificial layer is advantageously between 0.2 $\mu$m and 2 $\mu$m.

The recessing of this sacrificial layer depends on the thickness of this sacrificial layer and the directivity of the metallic deposit.

If the sacrificial layer is thicker and the deposit not very directive, the recessing must be greater.

For a sacrificial layer with a thickness of 2 $\mu$m, its recessing R (FIG. 5) can be 10 $\mu$m.

It is valuable that the sacrificial layer can also serve as a layer blocking the etching during the deep etching of each hole in the substrate.

This is not necessary however.

For etching of holes through the substrate, the shape of the holes is of little importance.

The recessing of the sacrificial layer important however in allowing for the depositing of the metal without risking a short circuit between the electrical contact or stud and the substrate.

The case of a Si—$SiO_2$—Si assembly will now be considered.

Holes can be formed by anisotropic etching of the substrate with KOH or TMAH for example.

Figure 8:
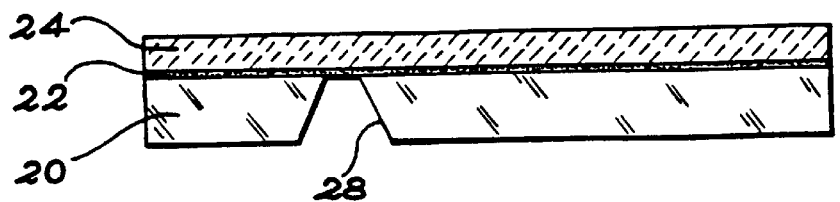

This is schematically illustrated by FIG. 8 which shows, in cross section, the substrate 20 covered with the sacrificial layer 22, which is itself covered by the layer 24 for the structure to be equipped with a contact.

There is also a hole 28 formed through the substrate by anisotropic chemical etching.

This hole can also be made by anisotropic etching using a plasma.

Depending on the etching conditions, the stopping of the etching, on an insulating layer, in this case a $SiO_2$ layer, can lead to lateral etching of the silicon which spreads along the $SiO_2$.

This lateral etching produces a cavity and an overhang which can be used as those obtained during etching of the insulating sacrificial layer.

In this case, it is not necessary to recess the sacrificial layer by moist etching.

Dry etching is sufficient.

Figure 9:
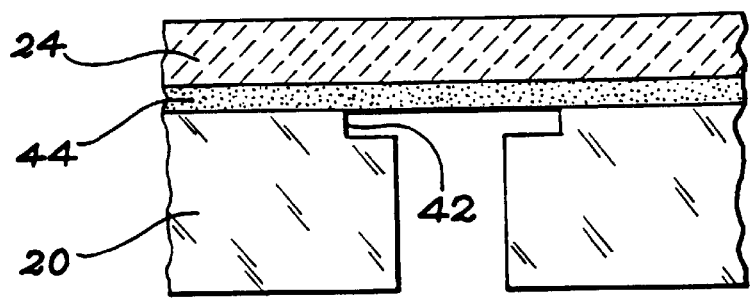

This is schematically illustrated by the cross section in FIG. 9 which shows the hole 28 obtained by etching of the substrate 20 by means of a plasma and a cavity 42 formed in the substrate on the side of the sacrificial layer 44, assumed here to be insulating, at the time of the stopping of the etching on this sacrificial layer.

Figure 10:
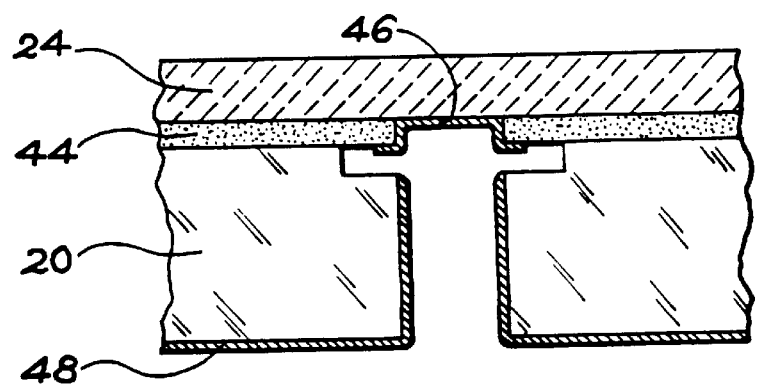

FIG. 10 shows the metallic deposit 46 formed on the rear side of the layer 24 and facing the hole 28 after the dry etching of this insulating layer 44 through the hole 28.

There is no short circuit between the substrate and the deposit 46 which is to serve as a contact for the structure 26.

The metallic deposit 48 formed on the rear side of the substrate and the walls of the hole is also seen.

Returning to the example in FIG. 8, after anisotropic etching of the substrate, chemical etching of the sacrificial layer is done, for example for 5 minutes with hydrofluoric acid.

Figure 11:
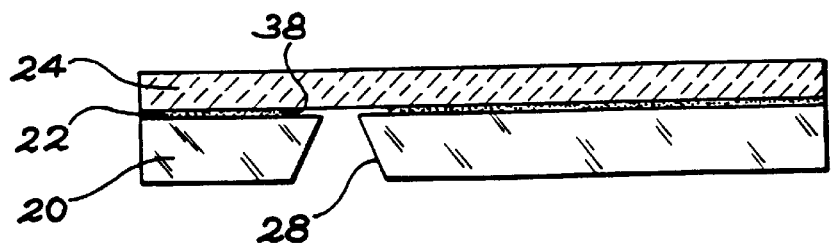

This is schematically illustrated in cross section on FIG. 11 which shows the cavity 38 formed in the sacrificial layer 22.

Figure 12:
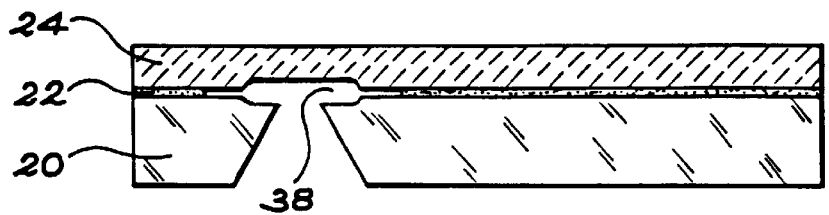

If this layer is not very thick with respect to the thickness of the metallic deposit formed later, for example in the case of a SIMOX substrate, anisotropic etching of the sacrificial layer can be done, for example for 1 minute using KOH or TMAH. Then another chemical etching of this sacrificial layer can be done, for example for 5 minutes using hydrofluoric acid to form the cavity 38 (FIG. 12).

The structure 26 is then formed, followed by the depositing of metal 32 on the rear side of the layer 24 facing the hole 28.

Figure 13:
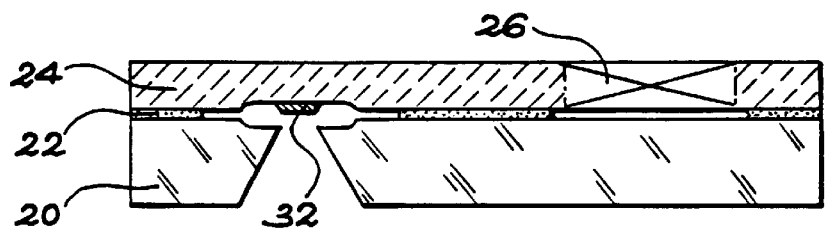

This is schematically illustrated by FIG. 13 which shows, in cross section, the structure 26 formed as well as the metallic deposit 32.

If the structure 26 is to be covered with a cap to protect against dust or for electrical screening or a means of confinement (in a vacuum or determined atmosphere), the cap is sealed, for example by anodic sealing in a vacuum.

Figure 14:
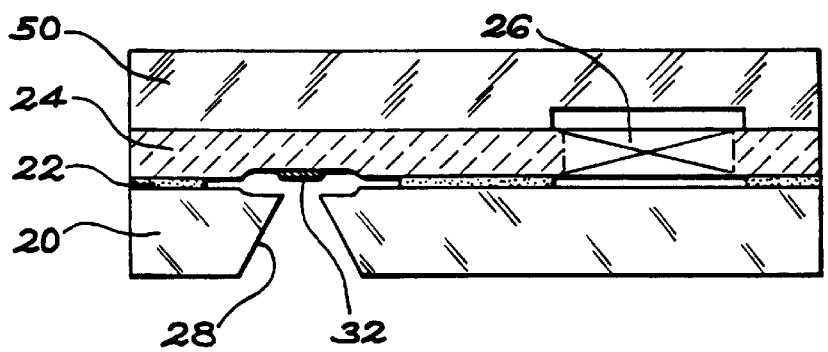

This is schematically illustrated by FIG. 14 which shows, in cross section, this cap 50 which protects the structure 26.

Figure 15:
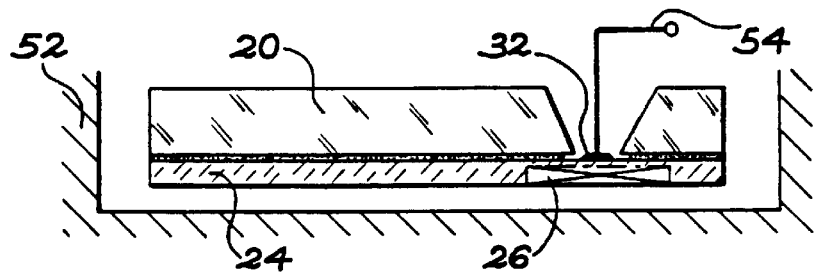

The structure 26 can then be put in a case 52 (FIG. 15) formed on the substrate 20 and equipped with a conducting wire 54 soldered to the electrical contact 32 with which the structure is equipped.

Rather than being equipped with a single electrical contact, the structure can be equipped, if necessary, with several electric contacts which are respectively formed through the holes in the substrate.

These holes are formed simultaneously in the substrate in the manner indicated above and the same is true for the holes.

What is claimed is:

1. Process for manufacturing a structure equipped with at least one electrical contact, comprising:

forming on a substrate a first layer;

forming on a front side of the first layer said structure equipped with at least one electrical contact;

forming at least one hole though the substrate revealing a rear side of the first layer;

forming a cavity at an end of said hole close to said first layer, said cavity formed transverse to an axial direction of said hole so as to form an overhanging edge opposite the first layer; and forming an electrical contact to said rear side of the first layer, the overhanging edge allowing for electrical insulation of the electrical contact from the substrate.

2. Process according to claim 1, wherein the forming a cavity comprises:

forming a sacrificial layer on the substrate; and etching the sacrificial layer through the at least one hole to form said cavity having said overhanging edge, said electrical contact formed on the rear side of the first layer through the at least one hole and said cavity.

3. Process according to claim 1, wherein forming an electrical contact comprises:

depositing metal through the at least one hole onto the rear side of the first layer.

4. Process according to claim 2, wherein the first layer is electrically conducting, the substrate includes a second layer which is electrically insulating, and the sacrificial layer is formed on this second layer and afterwards the first layer is formed on the sacrificial layer.

5. Process according to claim 2, wherein the first layer is electrically conducting, the substrate includes a second layer which is electrically insulating, and the first layer is formed on the second layer, the second layer comprising the sacrificial layer.

6. Process according to claim 2, wherein the sacrificial layer acts as a blocking layer during formation of the at least one hole.

7. Process according to claim 1, wherein the forming a cavity comprises:

forming a sacrificial layer on the substrate;

forming said first layer on the sacrificial layer;

etching the at least one hole to form said cavity and said overhanging edge on a rear side of the sacrificial layer away from said first layer; and etching the sacrificial layer to expose the first layer.

8. Process according to claim 1, wherein the step of forming at least one hole occurs prior to the step of forming on a front side of the first layer said structure.

9. Process according to claim 4, wherein the step of forming on a front side of the first layer said structure comprises:

forming a cap to confine the structure on the front side of the first layer.

10. Process according to claim 1 wherein the step of forming an electrical contact occurs after the step of forming on a front side of the first layer said structure.

11. Process according to claim 9, wherein the electrical contact is formed after formation of the cap.

* * * * *